United States Patent
Wright et al.

(10) Patent No.: US 7,561,433 B2
(45) Date of Patent: Jul. 14, 2009

(54) APPARATUS AND METHOD FOR A CLIP DEVICE FOR COUPLING A HEAT SINK PLATE SYSTEM WITH A BURN-IN BOARD SYSTEM

(75) Inventors: Nathan W. Wright, Missouri City, TX (US); Ronnie R. Schkade, Houston, TX (US); Noel T. Gregorio, Baguio City (PH); Richard J. Karr, Rowlett, TX (US); Charles R. Engle, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 207 days.

(21) Appl. No.: 11/102,060

(22) Filed: Apr. 8, 2005

(65) Prior Publication Data

US 2005/0225948 A1 Oct. 13, 2005

Related U.S. Application Data

(60) Provisional application No. 60/560,879, filed on Apr. 9, 2004.

(51) Int. Cl.
*H05K 7/00* (2006.01)
*H05K 7/20* (2006.01)
*H05K 1/14* (2006.01)
*H01L 23/34* (2006.01)

(52) U.S. Cl. .................. 361/747; 257/718; 361/769; 361/709; 361/719; 361/720; 361/736; 361/748

(58) Field of Classification Search ......... 361/719–720, 361/709, 736, 747–748, 769; 257/718
See application file for complete search history.

(56) References Cited

U.S. PATENT DOCUMENTS

| 4,970,761 | A | * | 11/1990 | Nakamura | 24/453 |
| 5,648,893 | A | * | 7/1997 | Loo et al. | 361/820 |
| 5,786,989 | A | * | 7/1998 | Kawabe | 361/759 |
| 6,037,660 | A | * | 3/2000 | Liu | 257/722 |
| 6,104,614 | A | * | 8/2000 | Chou et al. | 361/704 |
| 6,246,584 | B1 | * | 6/2001 | Lee et al. | 361/704 |
| 6,304,452 | B1 | * | 10/2001 | Lo | 361/704 |
| 6,307,748 | B1 | * | 10/2001 | Lin et al. | 361/704 |
| 6,374,906 | B1 | * | 4/2002 | Peterson et al. | 165/80.3 |
| 6,392,889 | B1 | * | 5/2002 | Lee et al. | 361/704 |
| 6,475,030 | B1 | * | 11/2002 | Chang | 439/557 |
| 6,552,905 | B2 | * | 4/2003 | Herring et al. | 361/704 |

(Continued)

*Primary Examiner*—Jayprakash N Gandhi
*Assistant Examiner*—Bradley H Thomas
(74) *Attorney, Agent, or Firm*—Mirna G. Abyad; Wade J. Brady, III; Frederick J. Telecky, Jr.

(57) ABSTRACT

In a burn-in test configuration wherein a chip board having a plurality of semiconductor chips engages a heat sink board having a plurality of heat sinks. When the boards are operationally engaged, each semiconductor chip has a heat sink spring-loaded against the semiconductor chip. Posts coupled to one board engage posts located on the other board. The engagement of the posts orients and secures the relative positions of the two boards. A clip is provided that secures the relative position of the two boards when the two sets of posts are engaged. To uncouple the two boards, a pressure on the side of the clip permits the two boards to separate.

4 Claims, 3 Drawing Sheets

U.S. PATENT DOCUMENTS

| | | | |
|---|---|---|---|
| 6,643,137 B1 * | 11/2003 | Chung et al. | 361/719 |
| 6,795,317 B1 * | 9/2004 | Liu | 361/704 |
| 6,829,143 B2 * | 12/2004 | Russell et al. | 361/704 |
| 6,865,083 B2 * | 3/2005 | Liu | 361/704 |
| 6,934,155 B2 * | 8/2005 | Aoki et al. | 361/704 |
| 6,950,310 B2 * | 9/2005 | Edwards | 361/721 |
| 7,017,258 B2 * | 3/2006 | Eckblad et al. | 29/729 |
| 7,019,979 B2 * | 3/2006 | Wang et al. | 361/719 |
| 7,310,229 B2 * | 12/2007 | Lee et al. | 361/697 |
| 7,345,880 B2 * | 3/2008 | Lo | 361/704 |
| 7,349,218 B2 * | 3/2008 | Lu et al. | 361/719 |
| 7,430,122 B2 * | 9/2008 | Li | 361/719 |
| 2004/0261977 A1 * | 12/2004 | Allen et al. | 165/96 |
| 2005/0135064 A1 * | 6/2005 | Chen et al. | 361/702 |
| 2006/0094296 A1 * | 5/2006 | Edwards et al. | 439/573 |

* cited by examiner

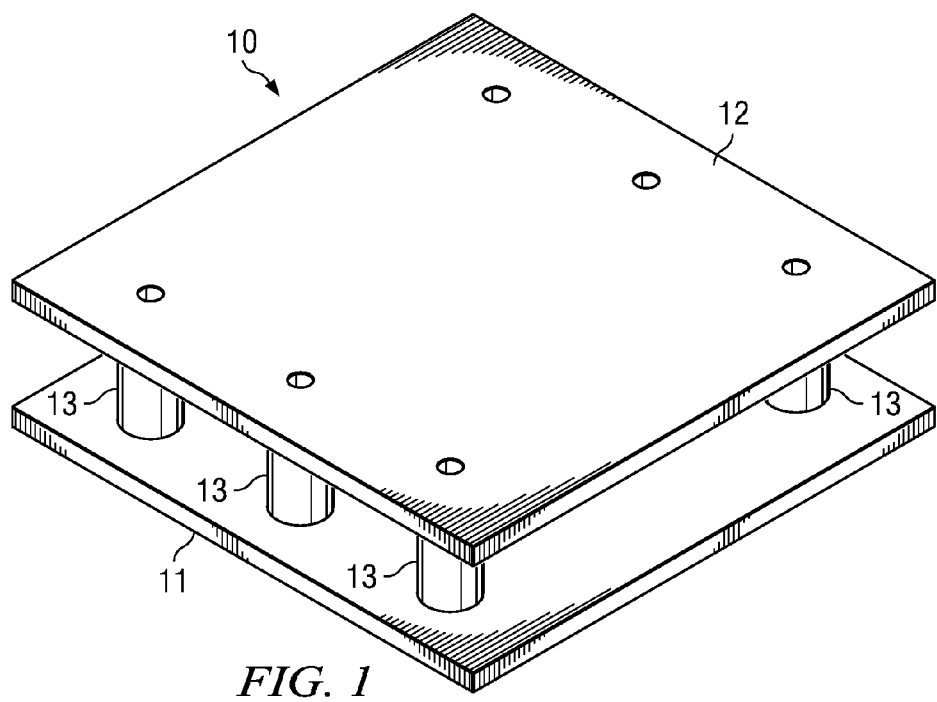
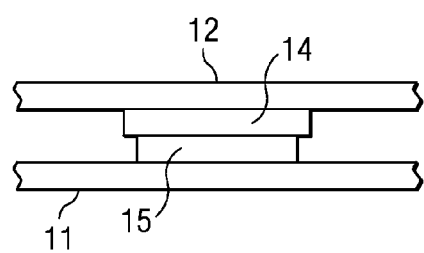
FIG. 1
(PRIOR ART)
FIG. 1A
(PRIOR ART)
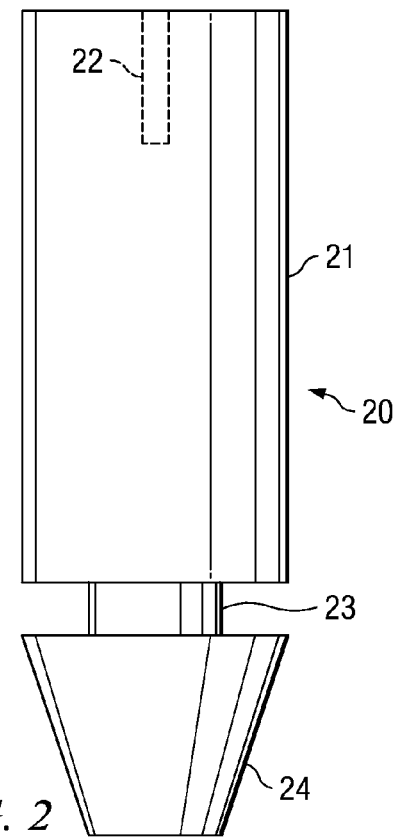
FIG. 2

APPARATUS AND METHOD FOR A CLIP DEVICE FOR COUPLING A HEAT SINK PLATE SYSTEM WITH A BURN-IN BOARD SYSTEM

This application claims priority under 35 USC §119(e)(1) of Provisional Application No. 60/560,879 (TI-37863PS) filed Apr. 9, 2004.

BACKGROUND OF THE INVENTION

1. Field of the Invention

This invention relates generally to data processing systems and, more particularly, to the testing of the chips upon which the data processing circuits have been fabricated.

2. Background of the Invention

As the density of electronic components on a chip has increased, numerous associated problems have arisen. For example, as the density of circuits fabricated on the chip has increased, the problems associated with heat dissipation of the chip have similarly increased. The "burn-in" of a chip is meant to insure that possible incipient defects are caused to fail prior to the chip reaching a customer. To further complicate the "burn-in" testing of chips, the increased number of circuits being tested means that additional time is required for the test procedures. If a larger number of circuits are activated simultaneously, the increased heat generation can cause chip failure that is not related to the circuit fabrication.

In U.S. Patent Application No. 60/560,879, an apparatus for cooling semiconductor chips during burn-in is disclosed. The apparatus 10 (FIG. 1) includes a chip board 11 for holding and activating a plurality of semiconductor chips or components. A heat sink board 12 is provided which, when operably engaged with the chip board, has a metal heat plate 14 in contact with each chip 15. An example of this is shown diagrammatically in FIG. 1A. In the preferred embodiment, each metal plate is spring-loaded against the integrated circuit, thereby assuring good thermal contact. Referring to FIG. 1, the posts 13 that provide the relative position and the spacing of the heat sink board 12 and the chip board 11 are shown.

One of the problems with the chip board and the heat sink board combination is the length of time and inconvenience to remove a chip board that has received the burn-in procedure from the heat sink board and replace the chip board with a chip board having unprocessed integrated circuits.

A need has therefore been felt for an apparatus and an associated method having the feature of providing an improved structure for burn-in testing of semiconductor chips. It would be yet another feature of the apparatus and associated method to provide for a quick attachment and detachment of a heat sink board and a chip testing board. It would be a still further feature of the present invention to provide for a quick coupling and decoupling of the heat sink board.

SUMMARY OF THE INVENTION

The foregoing and other features are accomplished, according to the present invention, by providing a post that is divided into two sections, a top post and a base post that are attached by a clip. The clip is attached to the same board as the base post. The top post has a notch surrounding the top post and a tapered end. The tapered end of the top post permits the top post, when inserted into the base post cavity and through an aperture in a top surface of the clip, to force an edge of the clip aperture aside. The bottom surface of the clip is attached to the same board as the base post. The side surface of the clip acts as a spring forcing the top surface of the clip into an aperture in the base post that extends into the cavity of the base post. When the heat sink board and the chip board are to be coupled, the top posts are inserted into the cavities of the base posts. The tapered portion of the top post pushes the top surface of the clip aside. Because of the spring-loading between the heat sinks and the chips, pressure will need to be applied. When the top post is sufficiently in the cavity of the base post, the spring action of the clip will force the edge of the clip aperture into the notch in the top post, thereby securing the heat sink board and the chip board in a predetermined relative position. To separate the two boards, pressure on the side surface of the clip will force the edge of the clip aperture out of the notch in the top post and because of the spring-loading, the boards will separate.

Other features and advantages of the present invention will be more clearly understood upon reading of the following description and the accompanying drawings and the claims.

BRIEF DESCRIPTION OF THE DRAWINGS

FIG. 1 is a perspective view of the prior art chip board/heat sink board configuration illustrating the posts that position and space the two boards.

FIG. 1A is a partial side view of the configuration of FIG. 1.

FIG. 2 is a side view of the top post according to the present invention.

DESCRIPTION OF THE PREFERRED EMBODIMENT

1. Detailed Description of the Figures

FIG. 1 has been described with respect to the related art.

Figure 3:
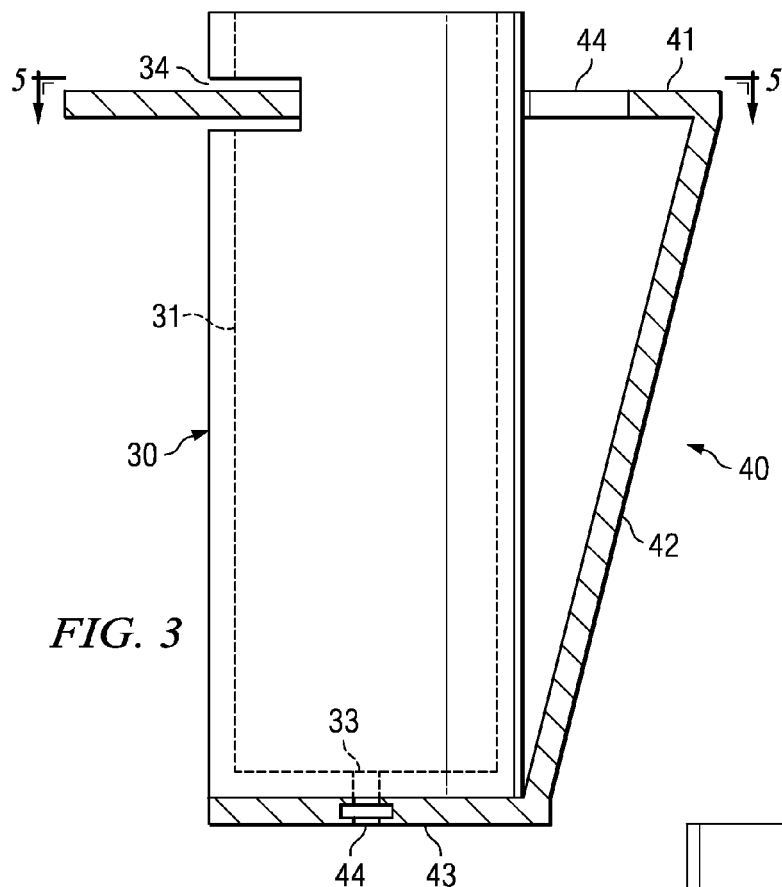
FIG. 3 is a side view of the base post and clip according to the present invention.
Figure 4:
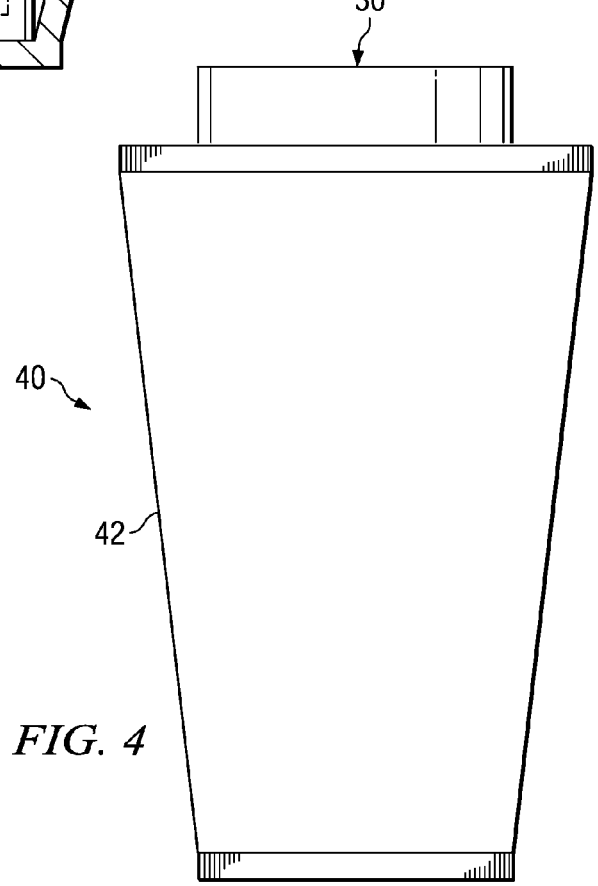
FIG. 4 is a back view of the clip according to the present invention.
Figure 6:
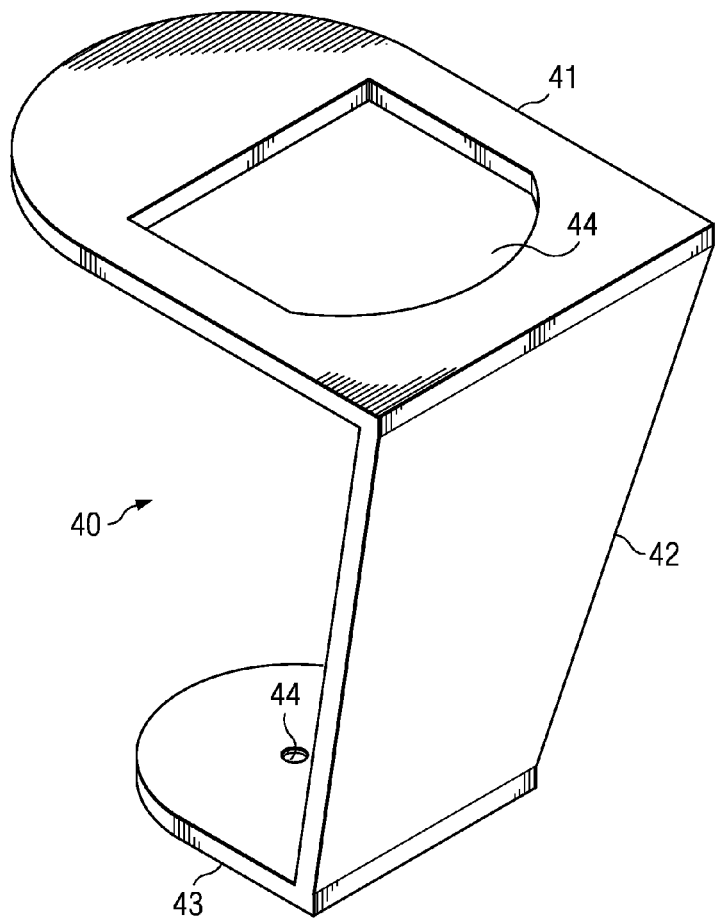
FIG. 6 is a perspective view of the clip according to the present invention.

Referring now to FIG. 2, FIG. 3, and FIG. 4, these Figures show the mechanism for coupling a chip board and a heat sink board according to the present invention. In the cross-sectional view of FIG. 2, top post 20 includes a generally cylindrical body 21, and a notch 23 formed in and around the cylindrical body 21. The top post 20 also includes a tapered portion 24 on the end of the top post facing the chip board 11, while on the other end a structure 22, for example a threaded cavity, provides the mechanism by which the top post is coupled to the heat sink board 12.

Referring to FIG. 3, a cross-sectional view of the base post 30 is shown. Base post 30 has a cylindrical structure that includes a cavity 31 into which the top post 20 is to be inserted when the chip board and the heat sink board are to be coupled. Base post 30 includes a structure 33 on the end proximate the chip board that is the structure that facilitates the coupling of the base post to the chip board 11. Base post 30 also includes an aperture 34 that extends through the sides of the cylindrical body 30 extending into the cavity 31.

Figure 5:
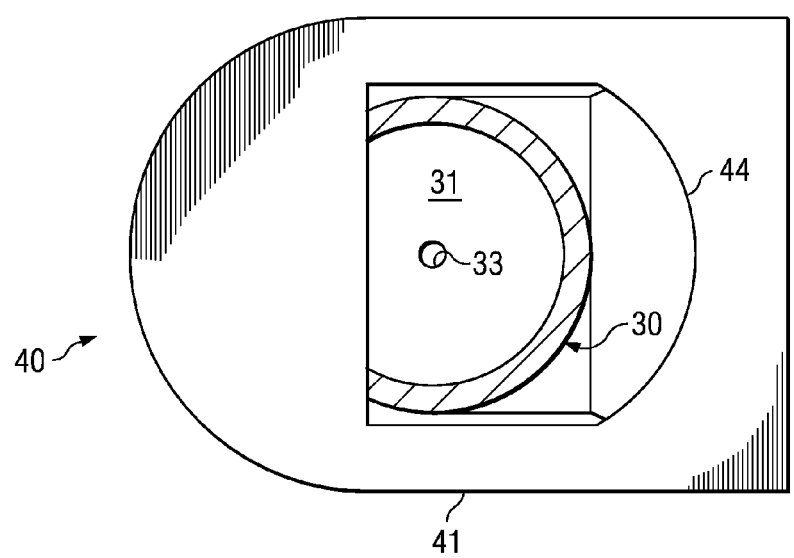
FIG. 5 is a top view of the clip according to the present invention.

FIGS. 2, 3, and 5 illustrate the structure of clip 40. In the bottom surface 43 of clip 40, an aperture 44 permits the mechanism for securing the base post 30 to the chip board 11 to simultaneously secure the clip 40 in place. The side member 42 of clip 40, connecting the lower member 43 with the upper member 41 acts as a spring. The upper member 41 of clip 40 has an aperture 44. When the clip 40 and the base post 30 are secured to chip board 11, the base post 30 extends through the aperture 44 in the top member 41 of clip 40. The relative position of the clip 40 and the base member 30 causes the spring action of side member 42 to force the edge of aperture 44 of the clip through aperture 34 in the base post 30 and into the cavity of base post 30. The top post 20 can then be inserted into the cavity of base post 30.

When the top post is inserted into the base post, the tapered geometry 24 of the top post forces the top member of clip 40 aside. When the top post 20 has penetrated the cavity of the bottom post to a sufficient extent, the notch 23 of the top post will be aligned with the top member 41 of the clip 40. The spring action of the clip 40 forces a portion of the clip aperture 44 into the notch 23 of the top post, thereby securing the relative relationship between the top post 20 and the base post 30. To disengage the top post 20 and the base post 30, pressure is applied to the side member 42 of clip 40, thereby forcing the side of the aperture 44 from contact with the notch of the top post. Because the heat sink elements of the heat sink board are in spring-loaded contact with the chips of the chip board, the disengagement of the clip 40 element from the top post will result in the heat sink board and the chip board being forced apart. Similarly, the spring-loading between the heat sink board and the chip board results in force being necessary to couple the boards.

2. Operation of the Preferred Embodiment

The foregoing discussion describes how a heat sink board and a chip board can be easily coupled and uncoupled. As will be clear, the positions of the top post and the base post on the two boards can be reversed. The side member of the clip should be oriented to provide easy access, particularly for uncoupling the two boards. The spring-loading of the heat sink components and the chip components provide that the uncoupling is relatively easy, requiring only a modest pressure on the side of the clip.

The dimensions of the posts and the clip are selected so that the relationship between the heat sink board and the chip board is appropriate for the geometries of the two boards.

As will be clear, the clip requires resiliency to engage the notch of the top post. Therefore, the clip should be fabricated, at least in part, with a material providing spring-like properties.

While the invention has been described with respect to the embodiments set forth above, the invention is not necessarily limited to these embodiments. Accordingly, other embodiments, variations, and improvements not described herein are not necessarily excluded from the scope of the invention, the scope of the invention being defined by the following claims.

What is claimed is:

1. A semiconductor test configuration, the configuration comprising:
    a chip board having a plurality of semiconductor chips;
    a heat sink board having a plurality of heat sinks;
    a plurality of rods coupled to one of said boards, each rod having a notch;
    a plurality of posts coupled to the other of said boards, each post including a hollow portion for receiving an associated one of the rods when the boards are positioned in a predetermined alignment, each post having an aperture providing access to the hollow portion; and
    a plurality of metal structures, each metal structure coupled to an associated post and having a member which, when the associated rod is received in the hollow portion of the associated post, enters the aperture of the associated post and engages the notch of the associated rod to couple the rod to the post;
    wherein one of the plurality of rods and the plurality of posts are secured to said chip board independently of said member.

2. The configuration as recited in claim 1, wherein pressure on respective sides of said metal structures permits the rods and posts to be uncoupled.

3. The configuration as recited in claim 1, wherein each semiconductor chip assumes a spring-loaded engagement with an associated heat sink when the rods and posts are coupled to one another.

4. The configuration as recited in claim 1, wherein each member is forced into the aperture of the associated post by the metal structure.

* * * * *